US008072045B2

(12) United States Patent
Peumans et al.

(10) Patent No.: US 8,072,045 B2
(45) Date of Patent: *Dec. 6, 2011

(54) EXTENDABLE CONNECTOR AND NETWORK

(75) Inventors: Peter Peumans, Palo Alto, CA (US); Kevin Huang, Atherton, CA (US); Fu-Kuo Chang, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/938,960

(22) Filed: Nov. 3, 2010

(65) Prior Publication Data

US 2011/0042832 A1    Feb. 24, 2011

Related U.S. Application Data

(63) Continuation of application No. 11/854,429, filed on Sep. 12, 2007, now Pat. No. 7,834,424.

(60) Provisional application No. 60/844,126, filed on Sep. 12, 2006.

(51) Int. Cl.
*H01L 29/06* (2006.01)
*H01L 29/40* (2006.01)

(52) U.S. Cl. .............. 257/618; 257/773; 257/E23.177; 438/6; 438/128; 361/776; 174/69

(58) Field of Classification Search .................. None
See application file for complete search history.

(56) References Cited

U.S. PATENT DOCUMENTS

| 6,370,964 | B1 | 4/2002 | Chang et al. |
| 6,743,982 | B2 | 6/2004 | Biegelsen et al. |
| 7,265,298 | B2 | 9/2007 | Maghribi et al. |
| 7,337,012 | B2 | 2/2008 | Maghribi et al. |
| 7,491,892 | B2 | 2/2009 | Wagner et al. |
| 7,629,691 | B2 | 12/2009 | Roush et al. |
| 7,834,424 | B2 * | 11/2010 | Peumans et al. ............... 257/618 |
| 2003/0057525 | A1 | 3/2003 | Fock et al. |
| 2004/0192082 | A1 | 9/2004 | Wagner et al. |
| 2005/0013151 | A1 | 1/2005 | Nathanson et al. |
| 2006/0038182 | A1 | 2/2006 | Rogers et al. |
| 2006/0286785 | A1 | 12/2006 | Rogers et al. |
| 2007/0032089 | A1 | 2/2007 | Nuzzo et al. |
| 2009/0067144 | A1 | 3/2009 | Lanzara et al. |
| 2009/0283891 | A1 * | 11/2009 | Dekker et al. ............... 257/690 |
| 2010/0116526 | A1 * | 5/2010 | Arora et al. ............... 174/254 |

OTHER PUBLICATIONS

Li et al. "Compliant thin film patterns of stiff materials as platforms for stretchable electronics." J. Mater. Res., vol. 20, No. 12 (2005).

(Continued)

*Primary Examiner* — Thanh V Pham
*Assistant Examiner* — Andres Munoz
(74) *Attorney, Agent, or Firm* — Crawford Maunu PLLC

(57) ABSTRACT

Extendable connectors are facilitated. According to an example embodiment, an integrated electrical circuit uses a connector that has first and second connected ends. The connector is unbundled from an initial state in which the first and second connected ends are separated by a first proximate distance and applied in an extended state in which the first and second connected ends are separated by a second distance that is greater than the first proximate distance.

16 Claims, 4 Drawing Sheets

OTHER PUBLICATIONS

Someya et al. Conformable, flexible, large-area networks of pressure and thermal sensors with organic transistor active matrixes. PNAS, vol. 102, No. 35, pp. 12321-12325 (Aug. 30, 2005).

Mack et al. "Mechanically flexible thin-film transistors that use ultrathin ribbons of silicon derived from bulk wafers." Applied Phys. Letters 88, pp. 213101-1 to 213101-3 (May 22, 2006).

Huang et al. "Stretchable silicon sensor network for structural health monitoring>" Proc. SPIE, vol. 6142, pp. 617412-1 to 617412-10 (Apr. 11, 2006).

Huang et al. "Large sensor networks built from monolithic silicon." DEStech Publications, pp. 1099-1102 (Sep. 2005).

* cited by examiner

EXTENDABLE CONNECTOR AND NETWORK

RELATED PATENT DOCUMENTS

This patent document is a continuation under 35 U.S.C. §120 of U.S. patent application Ser. No. 11/854,429 filed on Sep. 12, 2007 (U.S. Pat. No. 7,834,424); which claims the benefit, under 35 U.S.C. §119(e), of U.S. Provisional Patent Application No. 60/844,126 filed on Sep. 12, 2006 and entitled: "Stretchable Sensor and Sensor Network, and Related Methods of Use and Manufacture" which (with its Appendices) are fully incorporated herein by reference.

FIELD OF THE INVENTION

The present invention relates to extendable connectors, networks, their manufacture and their use.

BACKGROUND

For wired and wireless electrical networks, circuit components such as nodes, interconnects (where applicable) and individual devices are often desirably located in one or more certain spatial arrangements that suit particular applications. For instance, it is often desirable to place sensor circuits at select locations to facilitate the detection of conditions at the select locations.

Many network applications are also susceptible to damage or other undesirable effects that relate to the relative inflexibility of network components. For instance, conductive network connections (e.g., interconnects) that connect circuit nodes tend to be very inflexible and susceptible to damage when exposed to vibration or other harmful environmental conditions. Such damage can render circuits and networks inoperable.

Many network applications are also limited in their scalability as related to the above inflexibility or otherwise. This has made certain circuit applications relatively difficult to implement with a variety of applications, such as those benefiting from large, complex networks and, often, high-density networks.

Unfortunately, many circuit applications, such as those involving sensor circuits, which have attempted to address the above issues have been expensive, difficult to implement and prone to failure. These and other characteristics have continued to present challenges to many circuit applications.

SUMMARY

The present invention is directed to overcoming the above-mentioned challenges and others related to a variety of applications, including those discussed above. These and other aspects of the present invention are exemplified in a number of illustrated implementations and applications, some of which are shown in the figures, that may be applicable to the appendices incorporated from the underlying provisional, and characterized in the claims.

In connection with various example embodiments of the present invention, an extendable network of coupled nodes is formed and used to facilitate extension and positioning of the nodes via extendable connectors that couple the nodes. The nodes and connectors can be formed using, for example, a foundry-processed silicon wafer with definition via monolithic semiconductor processing approaches, such as those implemented with CMOS technologies, and can be extended to distances that may be of orders of magnitude greater than original fabricated distances. In this regard, small-scale manufacturing approaches are used to form relatively large-scale networks. The connectors are formed of one or more flexible materials that can be conductive or non-conductive, and serve to couple the nodes for extension and/or retraction thereof and, in some applications, to facilitate electrical connection to the nodes. The network is damage-tolerant, extendable and reconfigurable. The network of nodes is readily implemented for applications such as structural monitoring, radio frequency identification (RFID), medical imaging, large-area electronics, photosensing and photovoltaic sensing.

According to an example embodiment of the present invention, an integrated electrical circuit is formed using a connector that has first and second connected ends. The connector is unbundled from an initial state in which the first and second connected ends are separated by a first proximate distance, and applied in an extended state in which the first and second connected ends are separated by a second distance that is greater than the first proximate distance.

According to another example embodiment of the present invention, an integrated electrical circuit arrangement includes a connector that extends in order to couple network nodes. The connector extends from an initial state in which first and second connected ends of the connector are separated by a first proximate distance, to an extended state in which the first and second connected ends are separated by a second distance that is greater than the first proximate distance.

In connection with another example embodiment, an integrated electrical circuit arrangement includes a plurality of circuit nodes that are coupled by a connector to at least one other circuit node. Each circuit node includes an electrical device. The connectors extend, from an initial state in which first and second connected ends of each connector are separated by a first proximate distance, to an extended state in which the first and second connected ends are separated by a second distance that is greater than the first proximate distance.

The above summary is not intended to describe each illustrated embodiment or every implementation of the present invention.

BRIEF DESCRIPTION OF THE FIGURES

The invention may be more completely understood in consideration of the detailed description of various embodiments of the invention that follows in connection with the accompanying drawings, in which.

Figure 1:
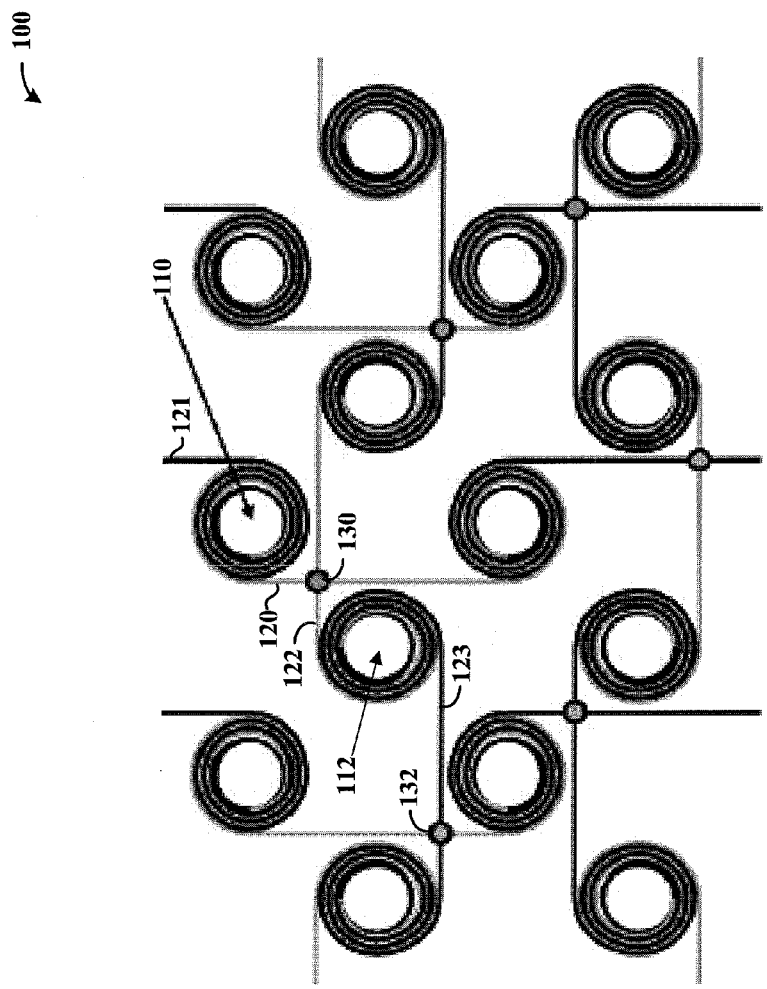
FIG. 1 shows an extendable network arrangement, according to an example embodiment of the present invention.

While the invention is amenable to various modifications and alternative forms, examples thereof have been shown by way of example in the drawings and will be described in detail. It should be understood, however, that the intention is not to limit the invention to the particular embodiments shown and/or described. On the contrary, the intention is to cover all modifications, equivalents, and alternatives falling within the spirit and scope of the invention.

DESCRIPTION

The present invention is believed to be applicable to a variety of different types of sensing devices, processes and applications benefiting from networks, such as sensor networks, monitoring networks and extendable (or stretchable) materials providing sensing functionality. The present invention has been found to be particularly suited for use with various sensing applications that use sensor networks implemented with extended or extendable structures. While the present invention is not necessarily limited to such applications, various aspects of the invention may be appreciated through a discussion of examples using this context.

According to certain example embodiments of the present invention, a sensing device includes an extendable structure that is coupled to nodes having one or more circuits such as a sensor circuit. The extendable material extends in at least one direction to facilitate the separation of the nodes. A plurality of such nodes can be implemented in a network arrangement, using the extendable structure to facilitate communications to each node (e.g., in a bus arrangement and/or using packet-based communications on the network).

In another example embodiment of the present invention, at least one electrical sensor is part of a silicon-on-insulator (SOI) circuit structure. Extendable material is situated substantially around the electrical sensor to secure the electrical sensor while the extendable material is extended or unraveled. The extendable material is separated or released from the SOI structure to facilitate extension and, in some applications, the electrical sensor is separated as well to permit movement or rotation of the sensor. In some applications, the sensing device is encapsulated in a polymeric dielectric film or a composite panel that protects the sensing device from various environmental conditions.

In some applications, the electrical sensor is connected to two interconnect ridges. In the event that one of the interconnect ridges is severed, the electrical sensor is adapted to isolate itself from the severed ridge, thereby avoiding short-circuiting. This facilitates reconfiguration of the sensing device and, where appropriate, shaping of the device via cutting or another approach.

In connection with other example embodiments, an SOI wafer is micro-patterned with analog and/or digital circuitry, including at least one sensor node and at least one spiral-like or hook-like interconnect. In some applications, an etching process such as deep-reactive-ion etching (DRIE) is used to define the at least one sensor node and the at least one spiral-like or hook-like interconnect. An electrical sensor is located at the sensor node, fabricated either before or after formation of the sensor node, and either at the sensor node or elsewhere and subsequently placed at the sensor node.

After the sensor is set, an underlying substrate layer is removed, releasing the sensing device. A force is then applied along at least one direction of the at least one spiral-like or hook-like interconnect thereby extending the interconnect. In one implementation, the sensing device is encapsulated in a flexible polymeric dielectric film before or after stretching.

In a particular application, the sensing network forms a built-in SHM system in a scalable fashion, with the network expanded to suit relatively large and complex SHM structures. A polymeric dielectric film or a composite panel is used with the sensing network to mitigate damage caused by the various mechanical, thermal and chemical environments that the structures may experience. The network is reconfigurable in the event of a local sensor failure via re-routing of electrical signals via the expanded interconnects.

A variety of sensors and other electrical devices are implemented at network nodes in accordance with various example embodiments of the present invention. Such devices may include, for example, processors, memory, microcomputers with processors and memory, piezoelectric sensors, heat sensors, strain sensors, stress sensors, displacement sensors and others.

Turning now to the Figures, FIG. 1 shows an extendable monolithic network 100 for extension and implementation with one or more of a variety of applications, according to another example embodiment of the present invention. In one example, network 100 includes sensor nodes 110 and 112, shown at the center of coiled connectors (e.g., formed around the nodes 110 and 112). Node 110 is coupled to coiled connectors 120 and 121. Node 112 is coupled to coiled connectors 122 and 123. Connectors 120 and 122 are coupled to a junction or node 130 which can provide a supporting function. Connector 123 is similarly coupled to and separates a supporting (conductive) junction or node 132. The connector extending from coiled connectors 120 to 123 extends between and separates nodes 130 and 132 and can be used in various applications. Connector 121 is at a boundary-type location and is either coupled to a similar supporting junction or node (if the network is continued) or to another electrical circuit, such as for integration with the other circuit or to provide an input or output connection to the network 100. In these contexts, while the network 100 is shown with fourteen sensor nodes, this (or another) network may further include many more (or fewer) nodes, depending upon the application.

The network 100 is formed using one or more of a variety of approaches. In one implementation, the network 100 is processed on a substrate such as a silicon-on-insulator (SOI) substrate, and defined using an approach such as deep reactive ion etching (DRIE) to form about a 20 μm-thick network of small (about 50-200 μm diameter) silicon islands (i.e., 110, 112). The islands are interconnected in a network using one or more layers of interconnects on top of spiral structures that also serve as springs.

Each of the network nodes (e.g., 110) includes a small, high-performance silicon integrated circuit (IC). In some applications, one or more of the nodes include a sensor with an analog-digital interface, local processor, and a network interface. Interconnect ridges form connectors (e.g., 120, 121) that are initially rolled-up around each network node. In this state, the interconnect ridges are generally stress- and strain-free or nearly stress- and strain-free. When pulling or extending force is applied at ends of the opposing interconnect ridges, the interconnects unroll and extend in the direction of the applied force until the point of full (e.g., maximum) extension is reached. This point of full extension corresponds generally to the total length of the interconnect ridges and, for example, a very small additional length to which the interconnect ridges may elastically extend (i.e., without undesirable deformation, cracking or breaking).

The connectors are generally extended to an extended state of varying length to suit different applications, but in which the first and second connected ends are separated by a distance that is greater than an initial distance but less than a threshold distance beyond which the connectors cannot extend. In this context, the threshold distance refers to one or more distances relative to the ability of the connector to stretch, such as an elastic stretching limit, an expanded distance beyond which the connector deforms or changes properties, or a distance beyond which the connector breaks when stretched. For instance, by bundling, coiling or rolling the connector in a first state, the ends of the connector can be extended in a second state to a separation distance that is large relative to the ability of the connector to stretch (e.g., were the connector first extended to its full length, then stretched).

In some applications, the point of full extension (or threshold length) corresponds to a maximum strain, c, that is below a strain at which failure occurs for a particular connector. Generally, this maximum strain is sustained in the section that unrolls last and is given by:

$$\max \varepsilon = \frac{w}{D},$$

where w is the width of the interconnect ridges and D the diameter of the innermost winding. Thus, for an interconnect ridge width of w=1 μm, and a maximum allowable strain of ∈=1%, the minimum diameter D is 100 μm. A large number of windings can be used to facilitate a large degree of extension. The maximum strain in these instances (~1%) is well below the yield strain of silicon substrate, dielectrics and metallic conductors. With these approaches, starting with an 8-inch silicon wafer, and assuming 1 μm-wide interconnect ridges, a very large two-dimensional (2D) network of sensors can be manufactured on a single wafer that can subsequently be stretched to a diameter of about 10 meters. The wafer can be diced into small dies (e.g., 1 cm²) containing about 2500 nodes, each of which can be extended to an area of approximately 1000 cm². For certain applications, the networks are implemented in a 20-30 μm-thick silicon film on top of a thicker (about 500 μm) silicon support wafer, separated by a sacrificial layer that can be removed by etching to lift-off the networks. As a result, in addition to their ability to extend in-the-plane, the networks can be bent out-of-plane with a minimum bending radius of:

$$R_{bending} = \frac{t}{2\max\varepsilon} = 1 \text{ mm},$$

where t=20 μm is the thickness of the silicon layer and the maximum allowed strain (max c) is about 1%. The small out-of-plane bending radius and in-plane ability to extend facilitates the conformation of the networks to many surfaces and structures.

The network 100 is powered using one or more of a variety of approaches. In some applications, power is supplied via the connectors as shown, or a layer in the connector (e.g., via multi-layered conductors similar to the multi-layered structure shown in the inset of FIG. 2 and discussed below). In other applications power is supplied using induction and circuits at the nodes are operated via radio frequency or other wireless communications approaches.

Figure 2:
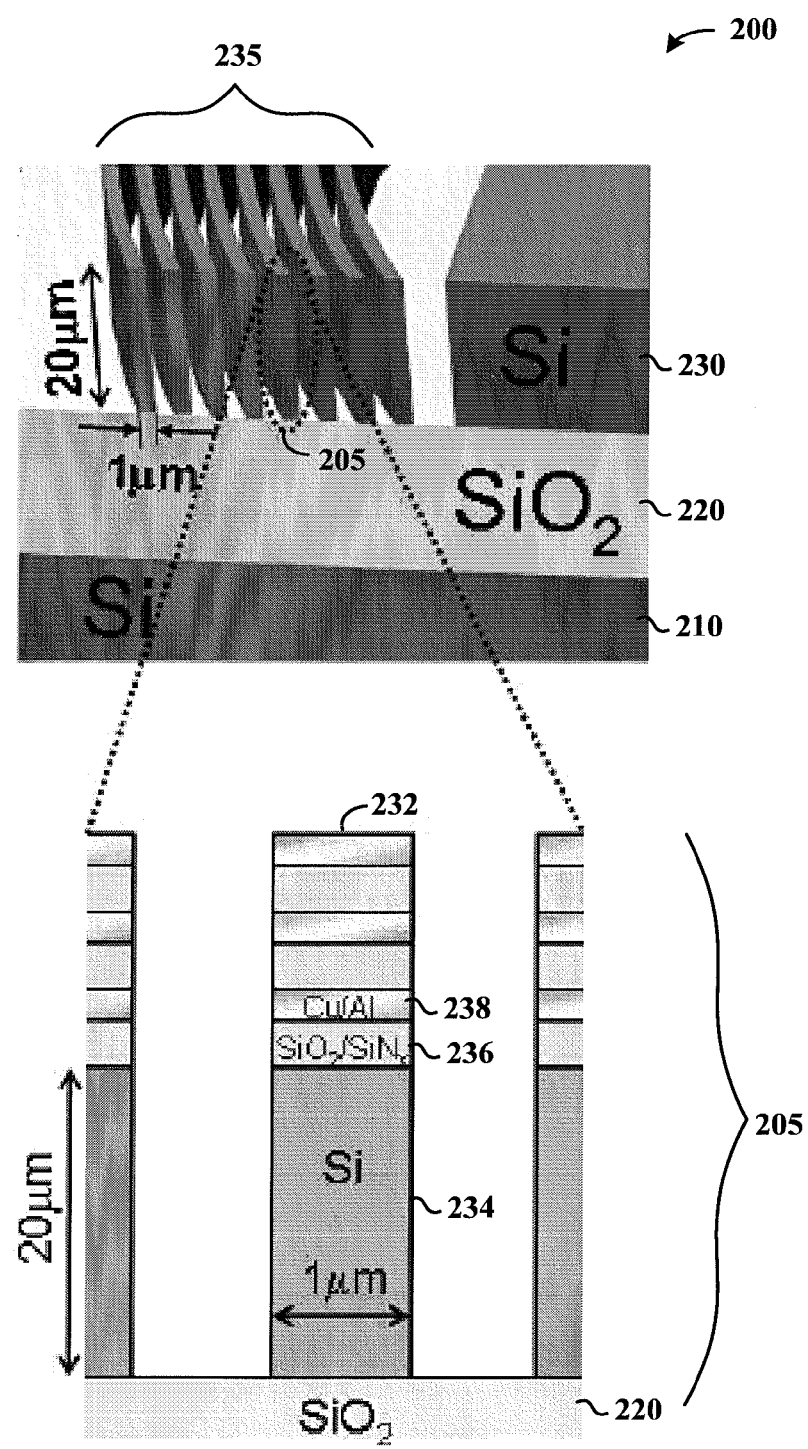
FIG. 2 shows a cross-sectional view of a circuit node and coiled interconnect, according to another example embodiment of the present invention.

FIG. 2 shows a cross-sectional view 200 of a circuit node 230 and coiled connector 235, with an inset 205 enlarged for illustration, according to another example embodiment of the present invention. The features in the cross-section 200 may be implemented, for example, with the network 100 shown in FIG. 1 to implement the various circuit nodes (e.g., 110, 112) and interconnects (e.g., 120, 121, 122, 123).

A silicon dioxide layer 220 is formed on a bulk silicon substrate 210, and the circuit node 230 and coiled connector 235 are formed from a silicon layer on the silicon dioxide layer 220 (i.e., from a silicon layer that forms part of a silicon (230)-on-insulator (220) structure).

Generally, a silicon layer from which the circuit node 230 and coiled connector 235 are formed is etched or otherwise processed to create the shown structures. In this illustrated example, the resulting structures are about 20 μm high, with each coil of the coiled interconnect 235 having a width of about 1 μm.

Referring to the inset view 205, a cross-sectional view of a coil 232 of the connector 235 is shown. A lower portion 234 of the coil is formed from the silicon layer as described above, with upper portions including interconnect material formed on the silicon layer. By way of example, two layers are shown (plus four additional layers) over the lower silicon portion of the connector coil 232, with the first layer 236 being an insulative layer (e.g., $SiO_2$ or $SiN_x$) and the second layer 238 being a conductive layer such as copper (Cu) or aluminum (Al). These shown, or alternative, layers may be formed as well to create alternative structures with material types being used to define conductivity/insulation characteristics.

Figure 3A:
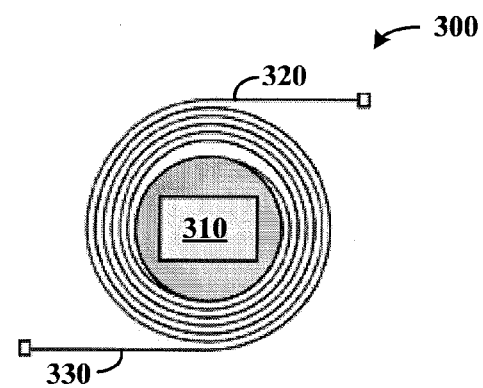
FIG. 3A-3C show a circuit node and two connectors in various states of extension, according to another example embodiment of the present invention.
Figure 3B:
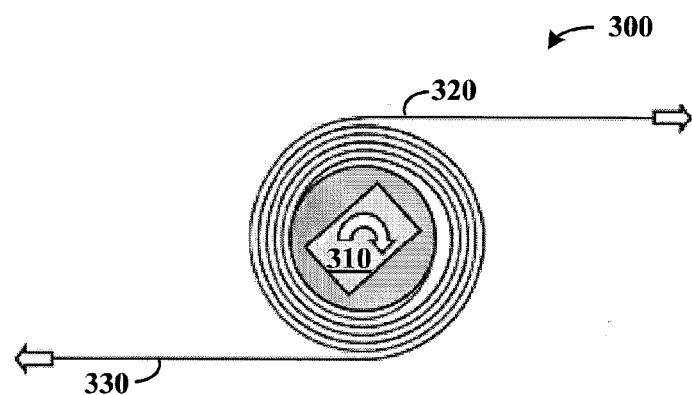
Figure 3C:
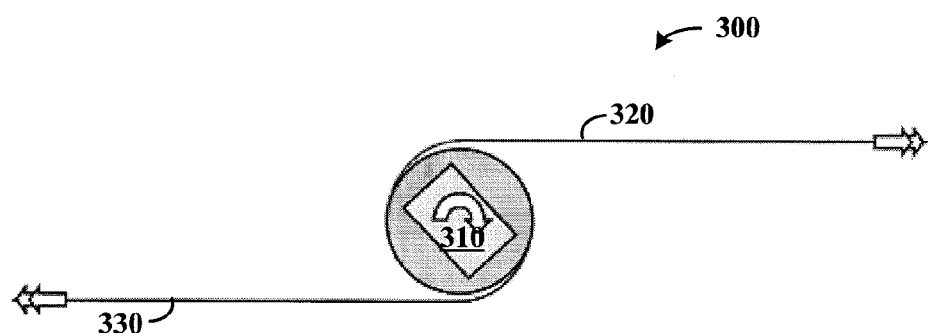

FIG. 3A-3C show an extendable circuit arrangement 300 in various states of extension, according to another example embodiment of the present invention. The extendable circuit arrangement 300 includes a circuit node 310 and two connectors 320 and 330 that are coiled around and are coupled to the circuit node. The circuit node 310 and respective connectors 320 and 330 are implemented in networks including two or many more similar extendable circuit arrangements, such as that shown in FIG. 1. For instance, the circuit node 310 may be implemented with node 110 and connectors 320 and 330 respectively implemented with connectors 120 and 121.

In FIG. 3A, the circuit arrangement 300 is in a first coiled state, which may correspond, for example, to a manufactured state with the connectors 320 and 330 substantially unstained and unstressed (e.g., as might be applicable with the network nodes and connectors as shown in FIG. 1, prior to expansion of the network). The circuit node 310 is implemented with one or more of a multitude of circuits that are coupled for connection via one or more interconnects in each connector.

In FIG. 3B, the connectors 320 and 330 have been extended and, as they are extended, the circuit node 310 rotates while generally remaining in place. This rotation is represented by way of example with a curved arrow in FIG. 3B. In this state, the connectors 320 and 330 have been partially extended, with a portion of the connectors remaining coiled around the circuit node 310.

In FIG. 3C, the circuit arrangement has been nearly fully-extended, with the majority of each of the connectors 320 and 330 extended and uncoiled from around the circuit node 310. The length of the connectors as shown in FIG. 3C may be substantially longer (e.g., several orders of magnitude longer), to significantly extend to suit particularly large applications.

The materials, radii of curvature, number of windings, extension and other characteristics of the connectors 320 and 330 (or, e.g., as relating to 235 in FIG. 2) are controlled to ensure that the connectors can be extended as desired for particular applications while maintaining their integrity (e.g., to electrically couple the circuit nodes). For instance, the above characteristics can be controlled in a manner that ensures that the strain in the connectors is below the strain at which failure occurs.

In some applications, coiled connectors are formed of material, shape and/or relative position to facilitate reversible stretching (e.g., reversing the positions shown in FIGS. 3A, 3B and 3C). For example, in some applications, the coils of the connectors 320 and 330 are arranged so that the coils nearer the circuit node 310 are coiled first, relative to coils further from the circuit node. In other applications, the coils of the connectors are coated to facilitate slip between the coils.

Figure 4:
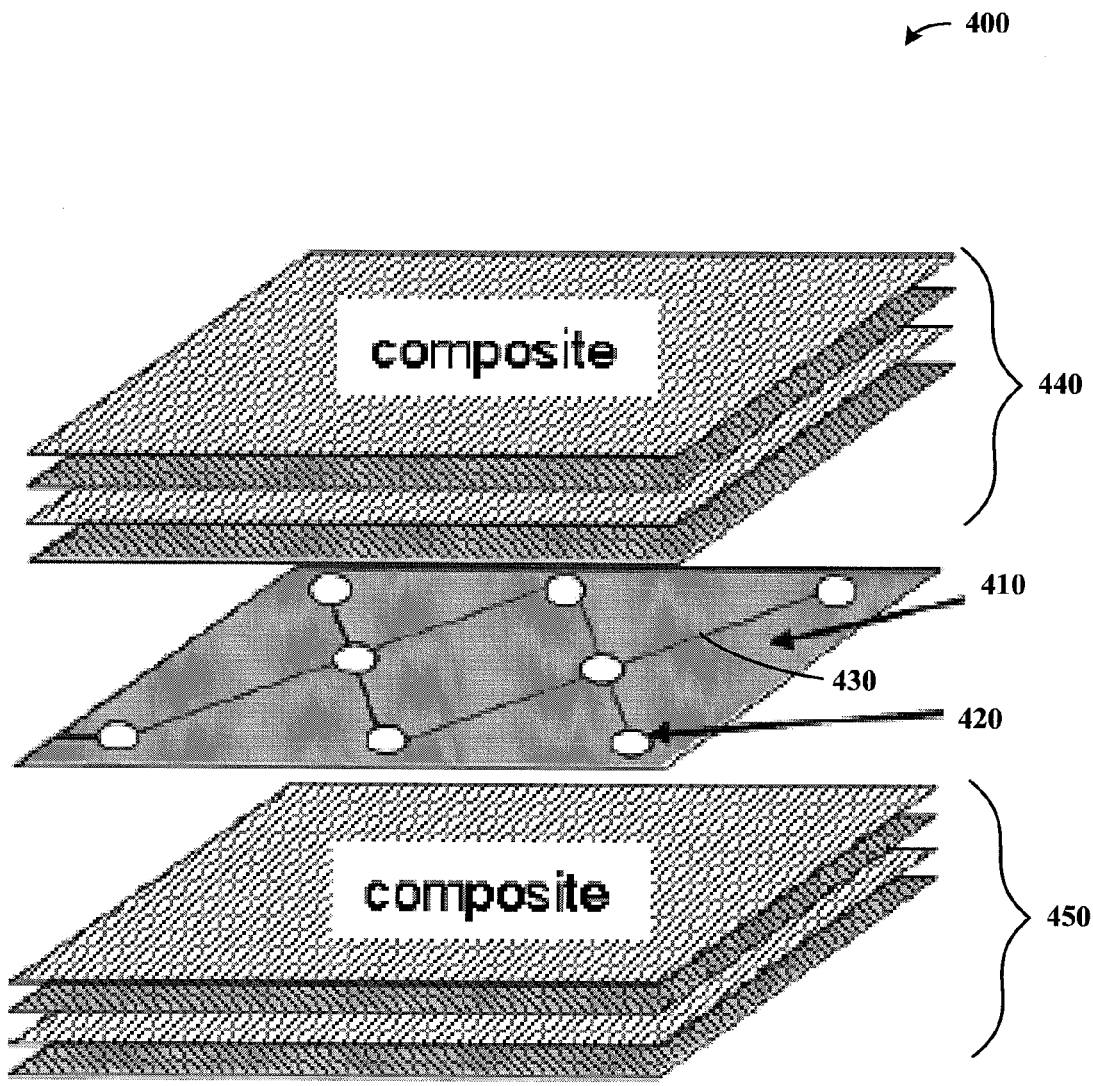
FIG. 4 shows an extended network embedded in a support substrate for composite structural integration, according to another example embodiment of the present invention.

The networks described herein may be implemented with a variety of structures and in a variety of forms, some of which are discussed or otherwise alluded to above. FIG. 4 shows one such approach involving a structure 400 that includes an extended network that is embedded in a support substrate 410 for composite structural integration, according to another example embodiment of the present invention. For illustration, FIG. 4 is described in connection with the use of various sensor or actuator nodes; however, the approaches discussed herein are applicable to the use of the arrangement in FIG. 4 with a multitude of circuits or other nodes.

The structure 400 includes sensor/actuator network having a plurality of nodes and connectors, with node 420 and connector 430 labeled by way of example. The network is embedded into a thin polymer support film 410 to form a SMART layer that can be subsequently cut to shape and integrated into a composite material including layers 440 and 450. The polymer support film 410 may, for example, include a protective material such as a chemically-resistant material suited for certain applications, to protect the nodes and connectors embedded therein.

By incorporating intelligence at the node level (420), the two-dimensional (2D) extendable networks can be automatically reconfigured when a connection breaks or a sensor fails. Generally, sensor nodes having two or more connectors leading to it can be accessed via any of the connectors such that the breaking of one of the connectors does not necessarily isolate the node in that messages or instructions can be re-routed over the network. In addition, node logic can be implemented to selectively isolate one or more nodes from certain connectors. For instance, when a particular connector is cut to shape the network, or inadvertently breaks, short-circuits can occur between the connector and other devise, or within interconnect layers built into the connector. In these applications, the node logic facilitates the isolation of a short-circuited connector and, where appropriate, re-routing of signals.

The density of sensors in the networks as described above, relative to their manufacture and/or the extent to which the networks are extended, can be set to suit particular applications. For instance, sensors are formed at high density to provide redundancy in the event of a significant number of the sensors failing, such that the remaining sensors can provide a dense array that can be used for applications such as structural damage detection (e.g., to provide real-time, high-resolution digital images of internal defects). One example of such a digital imaging approach involves ultrasonic wave scattering and time-reversal processing utilizing distributed sensors in a network as described herein (e.g., using embedded piezoelectric components).

In other embodiments and as may be applicable to one or more of the above-discussed networks, signals are processed and stored locally at each node in the network. The local processing facilitates desirable noise characteristics by reducing or eliminating signal corruption during the relaying of small electrical signals over large distances. Data can be locally sampled and stored in digital form, and the information can be processed at will without having to rely on a central processing unit to sample and store the signals recorded from different transducers. That is, each circuit node (e.g., node 110 in FIG. 1) can be implemented independently from other nodes that can also be formed in a monolithic device that is later extended.

In certain embodiments, data processing is distributed over two or more sensor nodes in a sensor network. The network acquires initial data on the structure in which the network is embedded or otherwise coupled to when first powered. During the lifetime of the structure, the network acquires data at set intervals (the interval may depend on the available power) and compares the current situation with the initial one. At a preprogrammed damage threshold, an alarm signal and diagnostic information (e.g., defect location, defect size, defect type) are generated and relayed to a central computer. With these approaches, power and communication connections of the network to the outside world can be wired or wireless, depending upon the application.

The networks described herein may be manufactured using one or several approaches. The following describes one such approach that may be used, for example, to form one or more of the arrangements as shown in the Figures and/or described above. A standard foundry process is used to pattern a SOI wafer with micro-patterned analog and digital circuitry at sensor nodes. Circuits such as ultrasound transducers, photovoltaic circuits or radio-frequency identification (RFID) circuits are fabricated on top of the sensor nodes. For instance, ultrasound transducers may be implemented with thin-film piezoelectric or MEMS-type transducers. RFID circuits may be implemented with several nodes forming an RFID antenna loop.

A deep-reactive-ion etching (DRIE) process is used to define sensor nodes and spiral interconnects, such as shown in FIG. 2, using an etch stop on a buried $SiO_2$ layer. Once formed, the patterned Silicon sensor network can be released from the underlying substrate by removal of the buried $SiO_2$ and subsequently extended and applied to a structure or for other purposes.

In some applications, the deep-reactive-ion etching (DRIE) process is implemented as follows. An aluminum etch mask is defined on wafers that are then subjected to a standard pre-metal clean, which includes 10 minutes in 4:1 $H_2SO_4$:$H_2O_2$ at 90° C., 10 minutes in 5:1:1 $H_2O$:$H_2O_2$:HCl at 70° C., and 50:1 HF dip for about 15-30 seconds. The wafers are dump-rinsed between each step and spin-dried at the end of the rinsing procedure. The SOI wafers with a 10 μm-thick device layer are then baked at 200° C. for 3 minutes and then sputter-coated with 500 nm of Al:Si (99% Al:1% Si) using a load-locked DC magnetron sputter tool. The chamber base pressure is 3×10−7 Torr and deposition takes place at 3×10−3 Torr, using 7.35 kW of power (399 V and 18.4 Amps) at 40° C. Patterns are defined via photolithography and the aluminum layer is etched using a Magnetically-Enhanced Reactive Ion Etch (MERIE) system using a sequence of three etch steps: breakthrough (15 s, 30 mTorr, 300 W, 40 sccm $BCl_3$, 10 sccm $Cl_2$), main etch with endpoint detection (~55 s, 200 mTorr, 450 W, 40 sccm $BCl_3$, 30 sccm $Cl_2$, 40 sccm $N_2$), and over-etch (10 s, 200 mTorr, 500 W, 40 sccm $BCl_3$, 40 sccm $Cl_2$, 40 sccm $N_2$).

The silicon layer is etched using the Bosch DRIE process with alternation of 5 seconds of $C_4F_8$ at 120 sccm as the passivation step and 6 seconds of $SF_6$ at 130 sccm as the etch step. The patterned aluminum layer acts as an etch mask. The base pressure is 1 mTorr and the pressure trip is 94 mTorr. During the etch step, the platen and coil power are 120 W and 600 W, respectively. During the passivation step, the platen and coil power are 0 and 600 W, respectively.

The structures are released from the SOI wafer by etching the buried oxide layer using a 49% HF solution for 30 minutes. The spirals are dried in order to avoid irreversible sticking of the 2D networks after the release process. After this step, the structures are picked up and extended for an application or applications to which they are suited.

A variety of specific example embodiments are described in Appendices A-D of the underlying and incorporated provisional application, as follows:
- A) "Stretchable silicon sensor networks for structural health monitoring;"
- B) "Large Sensor Networks Built from Monolithic Silicon;"
- C) "Stretchable Silicon Network;" and
- D) "SST: Damage-Tolerant, Stretchable, and Reconfigurable Silicon-Based Piezoelectric Sensor Networks for Structural and Medical Diagnostic Imaging."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, other applications are directed to the deployment of a sensor network as described herein with meter-sized microwave phased arrays for agile communication links, security imaging, automotive navigation, microwave tomography, concealed weapons detection and the detection of illegal passengers. Such modifications and changes do not depart from the true spirit and scope of the present invention.

What is claimed is:

1. A method of manufacturing an integrated electrical circuit that uses a connector that has first and second connected ends, the method comprising:
   providing the connector from a material layer on a substrate; and
   causing the connector to change from an initial state in which the first and second connected ends are separated by a first proximate distance, to an extended state in which the first and second connected ends are separated by a second distance that is at least an order of magnitude greater than the first proximate distance.

2. The method of claim 1, further including removing the connector from the substrate.

3. The method of claim 1, wherein the step of causing includes unbundling the connector, and prior to unbundling the connector, further includes
   forming a circuit layer on the substrate; and
   patterning the circuit layer to form the connector and circuit nodes coupled by the connector.

4. The method of claim 1, further including
   forming a layer of semiconductor material on the substrate;
   forming at least one interconnect layer on a semiconductor material layer;
   forming circuit devices at different locations in the semiconductor material, the circuit devices being electrically coupled to one another via at least one interconnect layer; and
   using the interconnect layer to form the connector.

5. The method of claim 1, further including the step of bonding the integrated electrical circuit to the substrate in the extended state.

6. The method of claim 1, wherein, in each of at least one of the initial and extended states, the connector is not stretched.

7. The method of claim 1, wherein the length of the connector in the initial and extended states is the same.

8. The method of claim 1, further including the steps of unbundling and applying a multitude of connectors that form an interconnected network coupled via nodes at respective ends of each of the connectors.

9. The method of claim 1, further including, applying the connector in an extended state, and providing the connector in a re-coiled state in which the first and second ends are separated by a proximate distance that is less than the second distance.

10. The method of claim 1,
    wherein the connector is a conductor, and
    further including applying the connector by using the connector to electrically couple circuit nodes.

11. The method of claim 1, further including coupling the connector to sensors, and using the connector to set the sensors relative to a structure for sensing characteristics of the structure.

12. The method of claim 1, wherein the connector is coiled in the initial state.

13. The method of claim 1, further including applying the connector in an extended state in which the first and second connected ends are separated by a second distance that is greater than a threshold distance beyond which the connector cannot be stretched.

14. An integrated electrical circuit arrangement comprising:
    an electrical connector to extend, from an initial state in which first and second connected ends of the connector are separated by a first proximate distance, to an extended state in which the first and second connected ends are separated by a second distance that is at least an order of magnitude greater than the first proximate distance;
    a plurality of said electrical connectors; and
    a plurality of circuit nodes, each electrical connector extending between and coupling a pair of the circuit nodes.

15. The arrangement of claim 14, further including an electrical device at each circuit node.

16. The arrangement of claim 14, further including a sensor at each circuit node to respond to conditions of a structure to which the integrated electrical circuit arrangement is applied.

* * * * *